(12) United States Patent
Wang et al.

(10) Patent No.: US 12,188,145 B2
(45) Date of Patent: Jan. 7, 2025

(54) DEVICE AND METHOD FOR CONTINUOUS VGF CRYSTAL GROWTH THROUGH REVERSE INJECTION SYNTHESIS

(71) Applicant: THE 13TH RESEARCH INSTITUTE OF CHINA ELECTRONICS TECHNOLOGY GROUP CORPORATION, Hebei (CN)

(72) Inventors: Shujie Wang, Hebei (CN); Niefeng Sun, Hebei (CN); Tongnian Sun, Hebei (CN); Huisheng Liu, Hebei (CN); Yanlei Shi, Hebei (CN); Huimin Shao, Hebei (CN); Lijie Fu, Hebei (CN); Jian Jiang, Hebei (CN); Xiaodan Zhang, Hebei (CN); Xiaolan Li, Hebei (CN); Yang Wang, Hebei (CN)

(73) Assignee: THE 13TH RESEARCH INSTITUTE OF CHINA ELECTRONICS TECHNOLOGY GROUP CORPORATION, Hebei (CN)

( * ) Notice: Subject to any disclaimer, the term of this patent is extended or adjusted under 35 U.S.C. 154(b) by 125 days.

(21) Appl. No.: 16/627,919

(22) PCT Filed: Dec. 21, 2018

(86) PCT No.: PCT/CN2018/122627
§ 371 (c)(1),
(2) Date: Dec. 31, 2019

(87) PCT Pub. No.: WO2020/118755
PCT Pub. Date: Jun. 18, 2020

(65) Prior Publication Data
US 2021/0285123 A1    Sep. 16, 2021

(30) Foreign Application Priority Data

Dec. 14, 2018 (CN) .......................... 201811532441.0

(51) Int. Cl.
*C30B 11/00* (2006.01)
*C30B 27/00* (2006.01)
*C30B 29/40* (2006.01)

(52) U.S. Cl.
CPC .......... *C30B 11/001* (2013.01); *C30B 11/006* (2013.01); *C30B 11/007* (2013.01); *C30B 27/00* (2013.01); *C30B 29/40* (2013.01)

(58) Field of Classification Search
CPC ... C30B 11/001; C30B 11/006; C30B 11/007; C30B 11/08; C30B 27/00; C30B 29/40
See application file for complete search history.

(56) References Cited

U.S. PATENT DOCUMENTS 3,933,435 A * 1/1976 Menashi ................. C30B 29/44
                                                    432/262
4,521,272 A * 6/1985 Gault .................... C30B 11/003
                                                    117/223

(Continued)

FOREIGN PATENT DOCUMENTS

CN           104120487 A   * 10/2014

*Primary Examiner* — Hua Qi
(74) *Attorney, Agent, or Firm* — Enable IP, P.C.

(57) ABSTRACT

The invention discloses a device and a method for continuous VGF crystal growth through reverse injection synthesis, relating to a device for preparing a semiconductor crystal and growing a single crystal, in particular to a method and a device for continuously growing the crystal in situ by using a VGF method and reverse injection synthesis. The device includes a furnace body, a crucible, a heat preservation system, a heating system, a temperature control system and a gas pressure regulation system, wherein the crucible is arranged in the furnace body, has a synthesis unit at its upper part, and has a crystal growth unit and a seed crystal unit at its lower part, and the synthesis unit is communicated with the crystal growth unit through capillary pores.

4 Claims, 8 Drawing Sheets

(56) References Cited

U.S. PATENT DOCUMENTS

| | | | | |
|---|---|---|---|---|
| 6,258,331 B1* | 7/2001 | Sanjoh | .................... | C30B 7/005 |
| | | | | 422/253 |
| 2009/0120325 A1* | 5/2009 | Kyota | ................. | C09B 67/0091 |
| | | | | 106/400 |
| 2009/0241829 A1* | 10/2009 | Han | ...................... | C30B 11/003 |
| | | | | 117/223 |

* cited by examiner

DEVICE AND METHOD FOR CONTINUOUS VGF CRYSTAL GROWTH THROUGH REVERSE INJECTION SYNTHESIS

TECHNICAL FIELD

The invention relates to a device for preparing semiconductor crystals and growing single crystals, in particular to a method and a device for continuous VGF crystal growth through reverse injection synthesis, applicable especially to VGF crystal growth of semiconductor crystal materials, such as indium phosphide, gallium phosphide and the like, which need to be synthesized with volatile elements.

BACKGROUND ART

The compound semiconductors such as indium phosphide, gallium phosphide, gallium arsenide, gallium nitride, silicon carbide and the like are widely applied in the field of photoelectrons and microelectronics for military and civil use, wherein the melt method is necessary for growth of the compounds such as indium phosphide, gallium phosphide, gallium arsenide and the like, and these semiconductor materials are either synthesized before crystal growth or directly synthesized to be continuous crystal to grow. The continuous crystal growth through direct synthesis renders materials of high purity and saves the costs, and thus has drawn more attention.

Vertical Gradient Freeze (VGF) is one of the preferred methods for preparing low-defect crystals. Therefore, it's very important to develop the technology of continuous VGF crystal growth by direct synthesis, which lays the foundation for preparing the high-purity low-defect single crystal substrate.

The current technology, such as disclosed by the Chinese patents "VGF Pressure Furnace for Compound In-situ Synthesis and Continuous Crystal Growth" (Application No. 201610135278.9) and "Method for In-situ Injection Synthesis of Phosphide by Using Bearing Gas" (Application No. 201711298581.1), adopts the gasification of phosphorus above a raw material (such as indium) and then injection of the gasified phosphorus into a melt; in crystal growth, an indium phosphide polycrystalline material is required to be added in advance to protect a seed crystal from being corroded or melted by the indium melt.

SUMMARY OF THE INVENTION

It's an object of the invention to provide a device and a method for efficiently synthesizing semiconductor materials, such as indium phosphide, gallium phosphide and the like, which need to be synthesized with volatile elements, and carrying out crystal growth in situ.

In order to achieve the above object, the invention adopts the following technical solution:

1. A device for continuous VGF crystal growth through reverse injection synthesis, comprising a furnace body, a crucible, a heat preservation system, a heating system, a temperature control system and an gas pressure regulation system, wherein the crucible, disposed in the furnace body, has a synthesis unit at its upper part, and has a crystal growth unit and a seed crystal unit at its lower part, and the synthesis unit is communicated with the crystal growth unit through capillary pores.

Further, the number of the capillary pores is more than one, the radius of the capillary pores is 0.1 mm-0.15 mm, and the height of the corresponding melt is 50 mm-150 mm.

2. A method for continuous VGF crystal growth through reverse injection synthesis, comprising the steps of:
   A. respectively feeding a solid seed crystal, a volatile element and boron oxide, and required metal and boron oxide for synthesis into the seed crystal unit, the crystal growth unit and the synthesis unit of the crucible in the furnace body;
   B. vacuumizing the furnace body to $10^{-5}$ Pa, and filling high-purity inert gas to 2.0 MPa;
   C. heating the crystal growth unit to above the sublimation temperature of the volatile element;
   D. heating the synthesis unit to 30° C.-100° C. higher than the melting point of the synthesized substance, ensuring that the lower limit value of the pressure of the furnace body is greater than the saturated vapor pressure of the volatile element at the aforementioned temperature, keeping the temperature of the crystal growth unit stable, enabling vapor of the volatile element to enter the synthesis unit through the capillary pores and to synthesize with the metal melt required for synthesis until bubbles of the capillary pores disappear;
   E. adjusting the temperature above the upper surface of the boron oxide layer of the crystal growth unit to be 10° C.-150° C. higher than the melting point of the synthesized substance, and the temperature below the boron oxide layer to be lower than the melting point of the synthesized substance, until bubbles of the capillary pores disappear;
   F. adjusting the temperature of the part, close to the capillary pore, of the upper part of the crystal growth unit to be higher than the melting point of the synthesized substance, and the temperature of the rest part to be lower than the sublimation temperature of the volatile element until the melt completely enters the crystal growth unit; and
   G. adjusting the temperature of the crystal growth unit to be higher than the melting point of the synthesized substance, and controlling the temperature distribution to carry out crystal growth.

In the invention, the growth unit has two functions of: 1. placing the volatile element in the material synthesis stage and heating until the volatile element gasifies, and 2. carrying out single crystal growth after material synthesis. The capillary pores have two functions of enabling firstly, the gasified volatile element to enter the synthesis unit from the growth unit, and secondly, the melt to enter the synthesis unit from the growth unit.

Taking indium phosphide as an example, the volatile element is red phosphorus, the metal required for synthesis is indium, and the synthesized substance is indium phosphide.

After gasification, the red phosphorus enters the synthesis unit from its bottom through the capillary pores, and fully reacts with the liquid indium in the synthesis unit and is absorbed by the indium. After the reaction is finished, indium-phosphorus melt drops into the crystal growth unit from the synthesis unit through the capillary pores, in the process, the seed crystal is protected by temperature control and boron oxide liquid sealing, and then the crystal growth is carried out through controlling the gradient distribution of the temperature in the growth unit.

There are several forces that interact during material synthesis: $\sigma$, interfacial tension of melt, P1, pressure in the crystal growth unit (saturated vapor pressure of phosphorus), P2, pressure in the synthesis unit, P3, pressure generated by a height of the indium melt, $\Delta P$, additional pressure generated by the interfacial tension.

The upward pressure generated in the crystal growth unit P1, namely the saturated vapor pressure (atm) of the red phosphorus, satisfies the following formula:

$$\log_{10}^{P_i} = -\frac{6070}{T} + 8.67$$

the saturated vapor pressure of red phosphorus was 4.3 MPa at 590° C. and 12.4 MPa at 650° C. The downward pressure generated by the bubbles entering the synthesis unit through the capillary pores, namely the interfacial tension of the indium melt σ satisfies the following formula:

$$\sigma = 559.7 - 0.089(T - 429).$$

When T=1335 K, σ=479.066 mN/m², the density of the indium melt ρ=6409.7 Kg/m³.

When the synthesis is carried out, the interfacial tension produces a downward additional pressure ΔP is as follows:

$$\Delta P = \frac{2\sigma}{r}$$

where r is the radius of a capillary pore and r=0.1 mm.

On the above basis, ΔP=980 Pa=0.00958 MPa when T=1335 K.

The pressure generated by the 100 mm melt itself was P3=ρgh=0.00628 MPa. The height of the indium melt is that in the synthesis unit and may also include the height of the indium solution flowing into the capillary pores inconsideration of accuracy of calculation.

The pressure P2 of the synthesis unit is mainly generated by the gas pressure of the inert gas, the lower limit value of which is greater than the saturated vapor pressure of phosphorus; in this case, P2=4.0 MPa.

The downward pressure=ΔP+P3+P2=0.00958+0.00628+4.0=4.01586 MPa.

The downward pressure is lower than the saturated vapor pressure of red phosphorus, bubbles of the red phosphorus may rise to the synthesis unit and the indium liquid may not flow down to the growth unit.

In the crucible, the height of the indium melt is 40 mm-50 mm.

The invention can achieve the following beneficial effects:

1. The capillary pores and the temperature & pressure control can enable different substances to be effectively isolated at the initial stage of device operation; in the material synthesis stage, the volatile element phosphorus bubbles rise to the metal indium melt, and after phosphorus gasification is finished, the indium-phosphorus melt drops into the growth unit to complete in-situ crystal growth. 2. The phosphorus gas rises from the bottom to the top of the indium melt and is fully reacted and absorbed. 3. The indium-phosphorus melt drops into the growth unit, the temperature is reduced by reducing the temperature of the growth unit and boron oxide, to protect the seed crystal.

Figure 1:
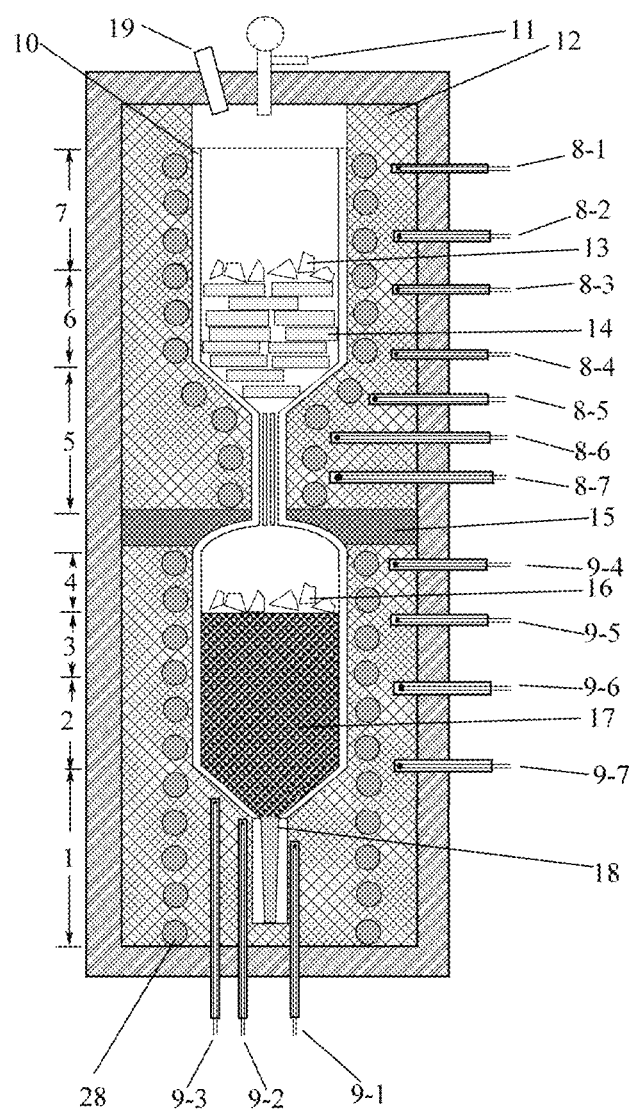
FIG. 1 is an assembly diagram showing a furnace body of a device for continuous VGF crystal growth through reverse injection synthesis.

In the drawings, 1: portion I of crystal growth heating zone; 2: portion II of crystal growth heating zone; 3: portion III of crystal growth heating zone; 4: portion IV of crystal growth heating zone; 5: portion I of melt synthesis heating zone; 6: portion II of melt synthesis heating zone; 7: portion III of melt synthesis heating zone; 8-1: thermocouple for melt synthesis a; 8-2: thermocouple for melt synthesis b; 8-3: thermocouple for melt synthesis c; 8-4: thermocouple for melt synthesis d; 8-5: thermocouple for melt synthesis e; 8-6: thermocouple for melt synthesis f; 8-7: thermocouple for melt synthesis g; 9-1: crystal growth unit thermocouple a; 9-2: crystal growth unit thermocouple b; 9-3: crystal growth unit thermocouple c; 9-4: crystal growth unit thermocouple d; 9-5: crystal growth unit thermocouple e; 9-6: crystal growth unit thermocouple f; 9-7: crystal growth unit thermocouple g; 10: synthesis and crystal growth crucible; 10-1: synthesis unit; 10-2: capillary; 10-3: crystal growth unit; 10-4: seed crystal unit; 11: gas charge and discharge pipe; 12: heat preservation layer; 13: boron oxide for solid synthetic covering; 14: high-purity indium; 15: heat insulation layer; 16: boron oxide for solid seed crystal protection; 17: high-purity red phosphorus; 18: seed crystal; 19: observation window; 20: boron oxide for liquid synthetic covering; 21: indium melt; 22: phosphorus bubbles; 23: boron oxide for liquid seed crystal protection; 24: drops of indium-phosphorus melt; 25: solid indium phosphide; 26: indium-phosphorus melt in the crystal growth unit; 27: indium phosphide crystals; 28 heating wire.

DETAILED DESCRIPTION OF THE INVENTION

The invention will now be further described with reference to the accompanying drawings.

In the embodiment, the crystal to grow is indium phosphide, namely the volatile element is red phosphorus, the metal required for synthesis is indium, and the synthesized substance is indium phosphide.

Figure 10:
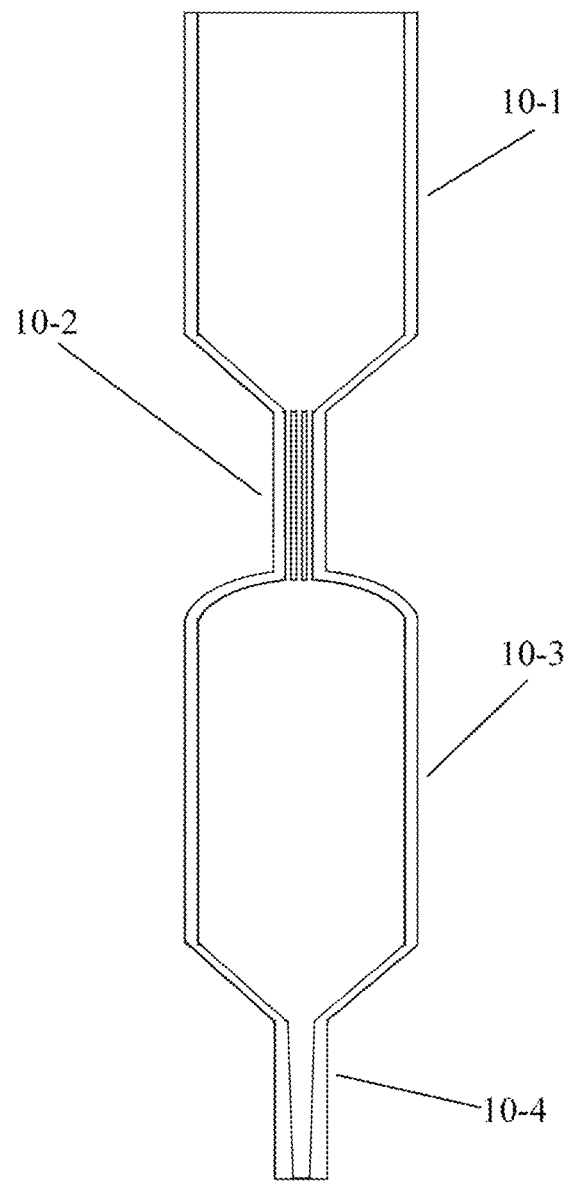
FIG. 10 is a schematic diagram of a crucible for the synthesis and the crystal growth.

As shown in FIG. 1, a device for continuous VGF crystal growth through reverse injection synthesis includes a furnace body, a crucible 10, a heat preservation system, a heating system, a temperature control system and a gas pressure regulation system, wherein the crucible 10 is arranged in the furnace body; with reference to FIG. 10, the crucible has a synthesis unit 10-1 at its upper part, and has a crystal growth unit 10-3 and a seed crystal unit 10-4 at its lower part, the synthesis unit 10-1 is communicated with the crystal growth unit 10-3 through capillary pores 10-2. At least one capillary pore is provided, and it's preferable to provide more theoretically, and preferably, in this example, 10 capillary pores are provided.

After high-purity indium is melted, the height value h of the indium melt is related to the radius r of a capillary pore at high temperature:

$$\rho g h < \frac{2\sigma}{r},$$

where ρ is the density of the indium melt, g is the acceleration of gravity, σ is the interfacial tension of the indium melt, and h is the height of the indium melt.

In this example, the capillary pore 10-2 has a radius of 0.1 mm to 0.15 mm.

A heat insulation layer 15 is provided between the synthesis unit 10-1 and the crystal growth unit 10-3 of the crucible.

An observation window 19 is provided at the top of the furnace body.

A heat preservation layer 12 constitutes the heat preservation system.

And the heating system includes a heating wire 28 arranged on the periphery of the crucible 10.

The temperature control system includes thermocouples 8-1 to 8-7 and 9-1 to 9-7.

The gas pressure regulation system includes a gas charge and discharge pipe 11 which probes into the crucible 10.

In order to accurately control the temperature in the crucible, with reference to FIG. 1, the temperature control zone in the crucible is divided into seven portions, respectively: 1: portion I of crystal growth heating zone; 2: portion II of crystal growth heating zone; 3: portion III of crystal growth heating zone; 4: portion IV of crystal growth heating zone; 5: portion I of melt synthesis heating zone; 6: portion II of melt synthesis heating zone; and 7: portion III of melt synthesis heating zone.

On the basis of the above device, the synthesis of materials and the growth of crystals were accomplished by the following steps.

A. Feeding: solid seed crystals 18 were filled into the seed crystal unit 10-4 of the crucible 10 in the furnace body, red phosphorus 17 and boron oxide 16 were added into the crystal growth unit 10-3, and indium 14 and boron oxide 13 were added into the synthesis unit 10-1. The boron oxide 16 in the crystal growth unit 10-3 was liquefied to function as protection, and the boron oxide 13 in the synthesis unit 10-1 was liquefied to function as a covering.

B. The furnace body was vacuumized to $10^{-5}$ Pa, and high-purity inert gas was charged therein to 2.0 MPa.

C. The crystal growth unit 10-3 was heated to above the sublimation temperature of red phosphorus, in this example, the heating temperature was lower than the sublimation temperature of red phosphorus plus 100° C.

Figure 2:
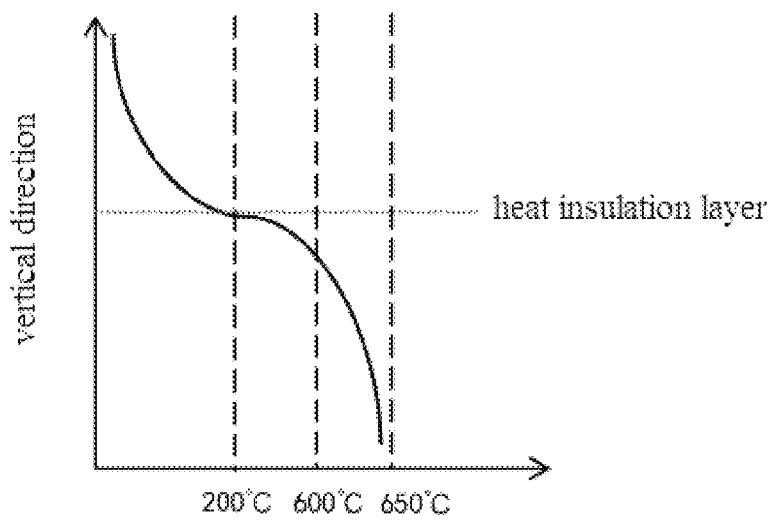
FIG. 2 is a schematic graph showing the temperature in the first stage of synthesis.

The heating powers in the portion I of the crystal growth heating zone, the portion II of the crystal growth heating zone, the portion III of the crystal growth heating zone and the portion IV of the crystal growth heating zone were adjusted, and boron oxide for solid seed crystal protection 16 and high-purity red phosphorus 17 in the crystal growth unit 10-3 were heated, so that the temperature in the crystal growth unit 10-3 reached higher than the sublimation temperature of the red phosphorus, as shown in FIG. 2.

The high-purity red phosphorus 17 started to decompose and volatilize, so that the pressure in the crystal growth unit 10-3 was greater than the pressure in the synthesis unit 10-1 above. At this time, the boron oxide for solid seed crystal protection 16 was melted into boron oxide for liquid seed crystal protection 23 and covered the seed crystal 18.

D. The synthesis unit 10-1 was heated to 30° C.-100° C. higher than the melting point of indium phosphide, while it was ensured that the lower pressure limit value of the furnace body was greater than the saturated vapor pressure of the volatile element at the temperature, the lower pressure limit corresponding to 30° C. higher than the melting point of indium phosphide was 3.0 MPa, the lower pressure limit corresponding to 100° C. higher than the melting point of indium phosphide was 3.4 MPa, and in this example, the pressure was greater than 4.0 MPa; the temperature of the crystal growth unit 10-3 was kept stable, the red phosphorus vapor entered the synthesis unit 10-1 through the capillary pores 10-2 to react with the indium 14 melt until bubbles of the capillary pores 10-2 disappeared.

Figure 4:
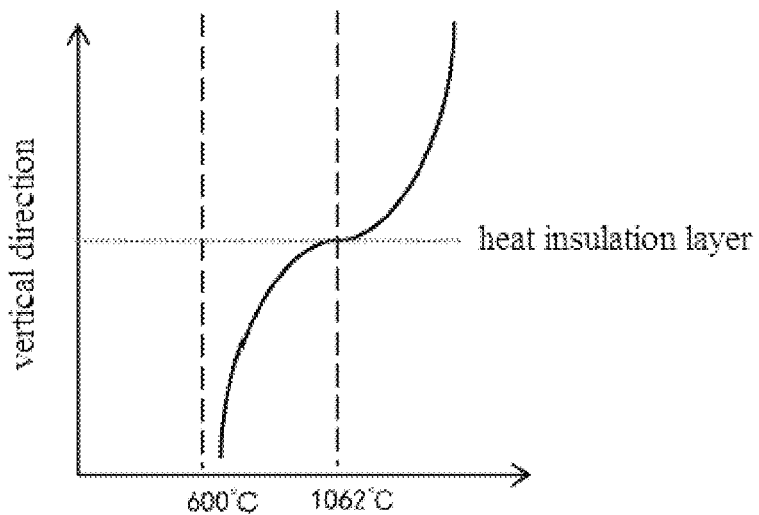
FIG. 4 is a schematic graph showing the temperature in the second stage of the synthesis.

The powers of the portion I of the melt synthesis heating zone 5, the portion II of the melt synthesis heating zone 6 and the portion III of the melt synthesis heating zone 7 were adjusted, and the boron oxide for solid synthesis covering 13 and the high-purity indium 14 in the synthesis unit 10-1 was heated so that the temperature of the synthesis unit 10-1 reached 30° C.-100° C. higher than the melting point of indium phosphide, as shown in FIG. 4, and the boron oxide for solid synthetic covering 13 and the high-purity indium 14 were melted into the boron oxide for liquid synthetic covering 20 and the indium melt 21.

The pressure lower limit value of the furnace body was ensured to be greater than 2.75 MPa, and meanwhile the temperature in the crystal growth unit 10-3 was ensured to be stable.

In addition, the upper pressure limit value of the furnace body was regulated according to formulas (1)-(4).

The reverse injection of red phosphorus had to satisfy the kinetic relationship provided in the following formulas.

The upward pressure generated by the crystal growth unit, i.e., the saturated vapor pressure (atm) of red phosphorus is a function of temperature:

$$\log_{10}^{P_1} = -\frac{6070}{T} + 8.67 \qquad (1)$$

where P1 was the saturated vapor pressure of red phosphorus.

Interfacial tension (mN/m) of the indium melt:

$$\sigma = 559.7 - 0.089(T - 429) \qquad (2)$$

when the synthesis was carried out, the bubbles entered the indium melt through the capillary pores and the maximum interfacial tension at the gas pipe created a downward additional pressure ΔP:

$$\Delta P = \frac{2\sigma}{r} \qquad (3)$$

The upper limit value of the pressure of the furnace body P2 was ensured to satisfy the following relation:

$$P2 < P1 - \Delta P \qquad (4)$$

The upper pressure limit satisfying the above conditions ensured that the phosphorus bubbles rose to the synthesis unit 10-1 through the capillary pores.

Figure 3:
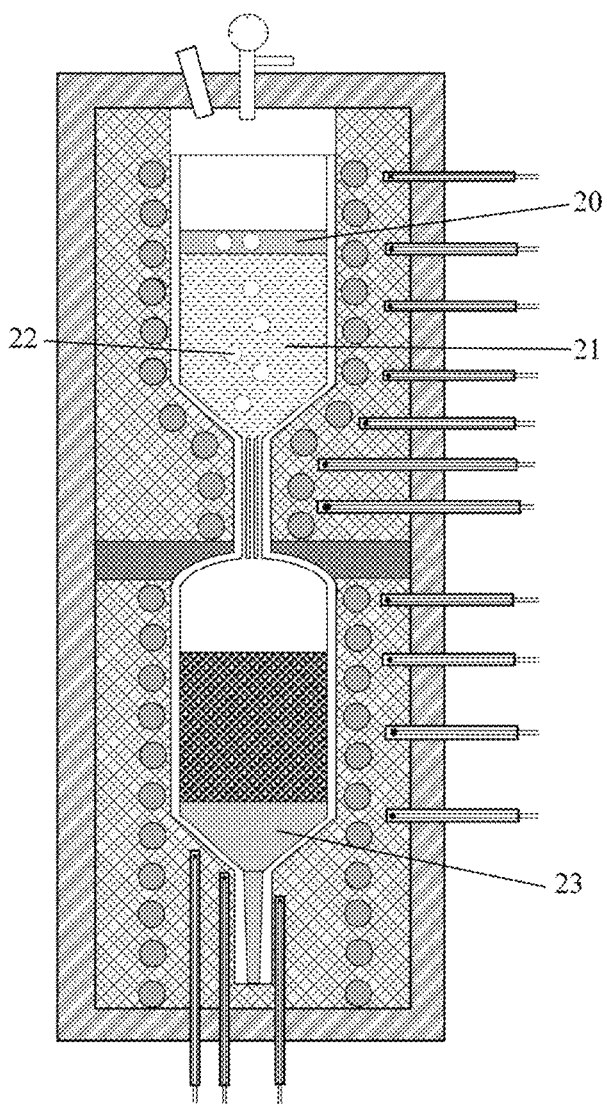
FIG. 3 is a schematic diagram showing the reverse injection synthesis process.

The phosphorus bubbles 22 volatilized in the crystal growth unit 10-3 were injected into the indium melt 21 in the synthesis unit 10-1 through the capillary pores 10-2 to start the synthesis reaction of indium and gaseous phosphorus, as shown in FIG. 3.

The change of the liquid level and the bubbling of the phosphorus were observed through the observation window 19 until the required solid red phosphorus volatilized completely and the bubbling disappeared.

E. The temperature above the upper surface of the boron oxide layer in the crystal growth unit 10-3 was adjusted to be 10° C.-150° C. higher than the melting point of the indium phosphide crystal, and the temperature below the boron oxide to be lower than the melting point of the indium phosphide crystal until the bubbles of the capillary pores 10-2 disappeared.

Figure 6:
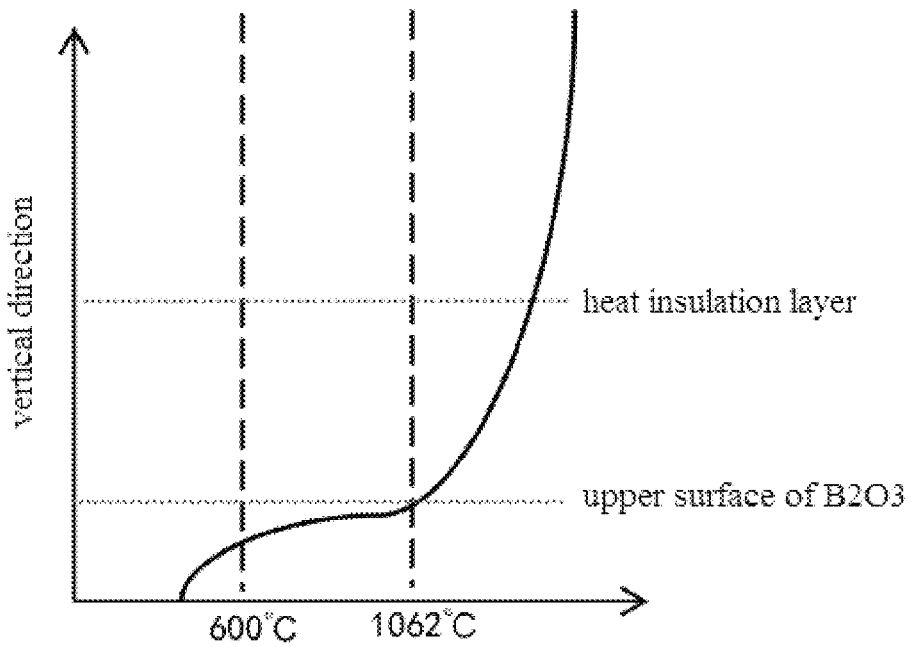
FIG. 6 is a schematic graph showing the temperature in the third stage of the synthesis.

The heating powers of the portion I of the crystal growth heating zone 1, the portion II of the crystal growth heating zone 2, the portion III of the crystal growth heating zone 3, and the portion IV of the crystal growth heating zone 4 were adjusted, so that the upper part of the crystal growth unit 10-3 had a temperature higher than the melting point of the indium phosphide crystal, and the part, close to the seed crystal unit 10-4, of the crystal growth unit 10-3 had a temperature lower than the melting point of the indium phosphide crystal, where the boron oxide for liquid seed protection 23 was present, as shown in FIG. 6.

And then, since the temperature inside the crystal growth unit 10-3 rose, the phosphorus gas remaining in the crystal growth unit 10-3 was injected into the synthesis unit 10-1 again, and the unreacted gas re-emerged from the melt in the synthesis unit 10-1 as bubbles. The change of the liquid level and the bubbling of the phosphorus were observed through the observation window 19 until the bubbling disappeared.

And then, solid phosphorus did not exist in the growth unit 10-3, and bubbles were generated again because the temperature of the crystal growth unit was raised again, the phosphorus gas expanded and thus bubbles were generated again, but the mole fraction of the gas was reduced; after the temperature was lowered again to 500° C.-600° C., the remaining phosphorus gas condensed into a solid, and the pressure of the crystal growth unit 10-3 was lowered, so that the upper melt flowed into the crystal growth unit.

F. The temperature of a part of the upper part of the crystal growth unit 10-3 close to the capillary pore (10-2) was adjusted to be higher than the melting point of indium phosphide by 1062° C., and the temperature of the rest to be lower than the sublimation temperature of red phosphorus by 590° C.

Figure 7:
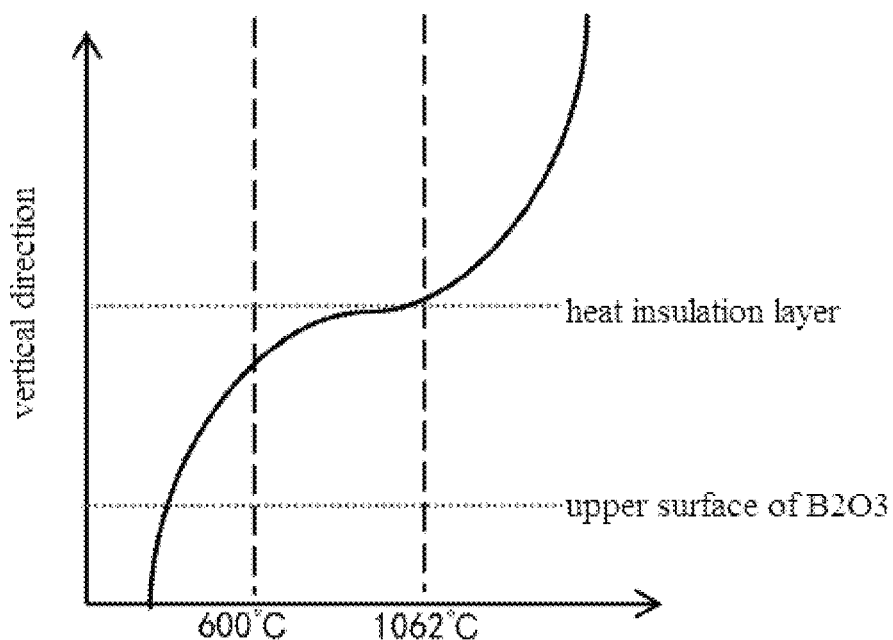
FIG. 7 is a schematic graph showing the suction temperature of the indium-phosphorus.

The heating powers of the portion I of the crystal growth heating zone 1, the portion II of the crystal growth heating zone 2, the portion III of the crystal growth heating zone 3, and the portion IV of the crystal growth heating zone 4 were adjusted, so that the temperatures of the crystal growth unit 10-3, the crystal growth unit thermocouple 9-5, the crystal growth unit thermocouple 9-6 and the crystal growth unit thermocouple 9-7 were lowered to below 500° C., and the temperature of the crystal growth unit thermocouple 9-4 higher than 1062° C., as shown in FIG. 7.

Figure 5:
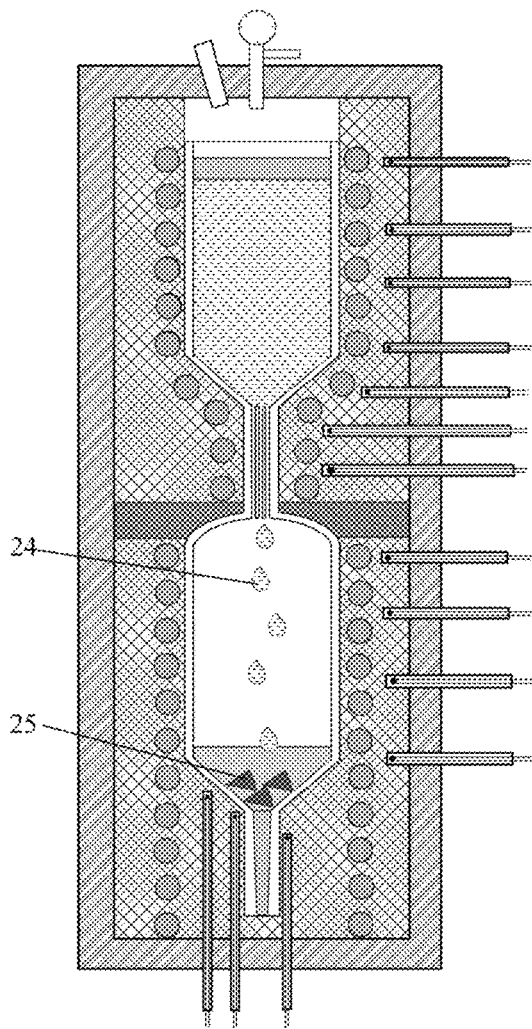
FIG. 5 is a schematic diagram showing an indium-phosphorus melt being filled into a crystal growth unit.

The remaining phosphorus gas in the crystal growth unit 10-3 started to be converted into phosphorus solids. And then, the pressure in the crystal growth unit 10-3 was reduced, and the indium-phosphorus melt 24 dropped from the synthesis unit 10-1 into the crystal growth unit 10-3 through the capillary pores 10-2 due to the pressure difference, as shown in FIG. 5.

The indium-phosphorus melt 24 dropped into the boron oxide for liquid seed crystal protection 23 to rapidly solidify into solid indium phosphide 25, and finally all the melt in the synthesis unit 10-1 dropped into the crystal growth unit 10-3. When the temperatures of the crystal growth unit thermocouple 9-5, the crystal growth unit thermocouple 9-6 and the crystal growth unit thermocouple 9-7 were lower to below 500° C., the furnace body could be filled with inert gas, the pressure was increased by 0.2-2.0 MPa, the pressure difference between the crystal growth unit 10-3 and the synthesis unit 10-1 was further increased to ensure that the indium-phosphorus melt 24 could smoothly drop into the crystal growth unit 10-3.

In addition, an discharge unit could be further provided on the crystal growth unit 10-3 in the crucible to directly communicate with the exterior of the furnace body, and in this step, by discharging, the internal pressure of the growth unit was reduced, facilitating the indium-phosphorus melt 24 dropping into the crystal growth unit 10-3.

G. The temperature of the crystal growth unit 10-3 was adjusted to be higher than the melting point of indium phosphide, and the temperature distribution was controlled to carry out crystal growth.

Figure 8:
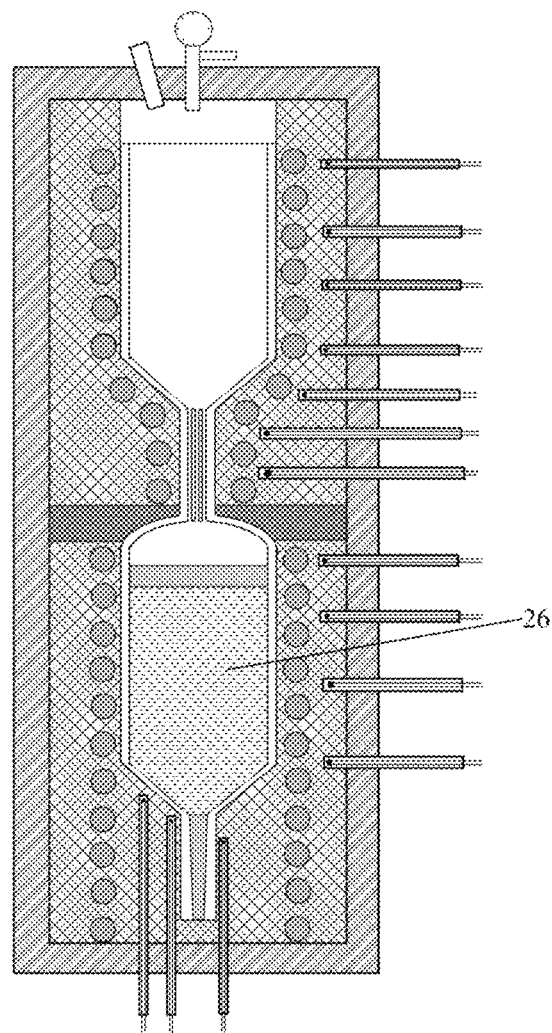
FIG. 8 is a schematic diagram showing completion of filling the indium-phosphorus melt into a crystal growth unit.

The heating powers of the portion I of the crystal growth heating zone 1, the portion II of the crystal growth heating zone 2, the portion III of the crystal growth heating zone 3, and the portion IV of the crystal growth heating zone 4 were adjusted, so that the temperature above the seed crystal unit 10-4 was higher than the melting point of indium phosphide, and the solid indium phosphide 25 was melted into the indium-phosphorus melt 26, as shown in FIG. 8.

Figure 9:
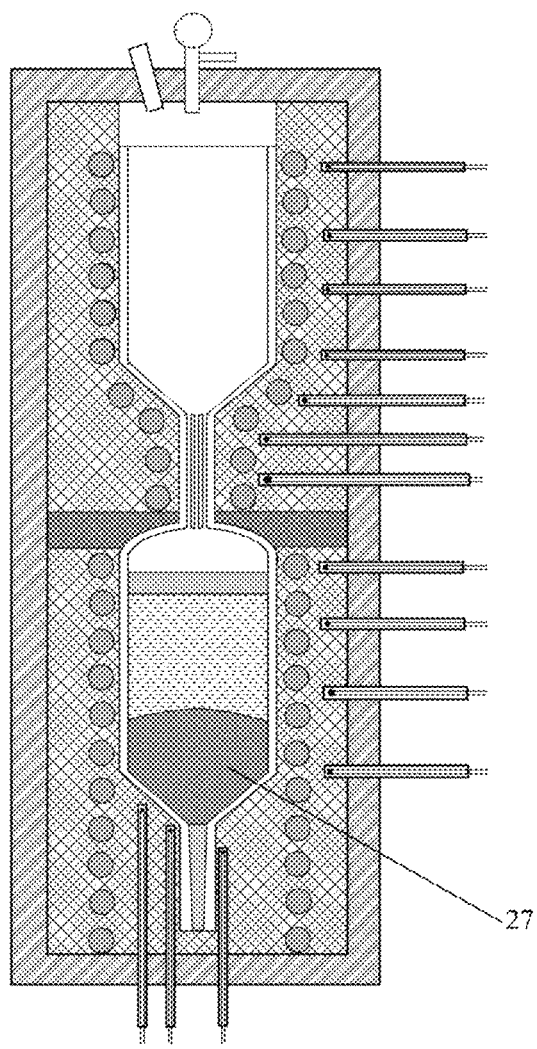
FIG. 9 is a schematic diagram of VGF crystal growth.

A temperature gradient from top to bottom was established, and then the temperature distribution was controlled to carry out VGF crystal growth. As shown in FIG. 9, the reference numeral 27 indicates the generated indium phosphide crystal.

The invention claimed is:
1. A device for continuous VGF crystal growth, comprising a furnace body, a crucible, a heat preservation system, a heating system, a temperature control system and a gas pressure regulation system,
characterized in that:
the crucible, disposed in the furnace body, has a synthesis unit at its upper part, and has a crystal growth unit and a seed crystal unit at its lower part, and the synthesis unit is communicated with the crystal growth unit through one or more capillary pores;
a relationship between a radius r of the one or more capillary pores and h is as follows:

$$\rho g h < \frac{2\sigma}{r}$$

where ρ is a density of a melt, g is the acceleration of gravity, σ is an interfacial tension of the melt, and h is a height of the melt in the synthesis unit in the crucible; and
each of the one or more capillary pores has the radius r of 0.1 mm to 0.15 mm;
wherein the one or more capillary pores enable gasified volatile element to enter the synthesis unit from the crystal growth unit and the melt to enter the crystal growth unit from the growth unit; and
wherein the heating system is configured to control temperatures of each of a first plurality of heating zones of the crystal growth unit and temperatures of each of a second plurality of heating zones of the synthesis unit to first cause the gasified volatile element to be injected from the crystal growth unit into the synthesis unit through the one or more capillary pores and then the melt to be dropped from the synthesis unit into the crystal growth unit through the one or more capillary pores.

2. The device according to claim 1, characterized in that: the number of the capillary pores is more than one.

3. The device according to claim 1, characterized in that: a heat insulation layer is provided between the synthesis unit and the crystal growth unit of the crucible.

4. The device according to claim 1, characterized in that: an observation window is provided at the top of the furnace body; the heating system comprises a heating wire arranged on the periphery of the crucible, the temperature control system comprises thermocouples, and the gas pressure regulation system comprises a gas charge and discharge pipe probing into the crucible.

\* \* \* \* \*